(12) United States Patent
Schmid et al.

(10) Patent No.: US 12,046,491 B2
(45) Date of Patent: Jul. 23, 2024

(54) INSPECTION UNIT OF A TRANSFER DEVICE FOR TRANSFERRING COMPONENTS BETWEEN SUBSTRATES

(71) Applicant: Muehlbauer GmbH & Co. KG, Roding (DE)

(72) Inventors: Konrad Schmid, Michelsneukirchen (DE); Uladimir Prakapenka, Roding (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 215 days.

(21) Appl. No.: 17/264,106

(22) PCT Filed: Aug. 23, 2019

(86) PCT No.: PCT/EP2019/072577
§ 371 (c)(1),
(2) Date: Jan. 28, 2021

(87) PCT Pub. No.: WO2020/043612
PCT Pub. Date: Mar. 5, 2020

(65) Prior Publication Data
US 2021/0313206 A1 Oct. 7, 2021

(30) Foreign Application Priority Data
Aug. 27, 2018 (DE) .................. 10 2018 006 760.3

(51) Int. Cl.
*H01L 21/67* (2006.01)
*H01L 21/68* (2006.01)
*H05K 13/04* (2006.01)

(52) U.S. Cl.
CPC .. *H01L 21/67259* (2013.01); *H01L 21/67132* (2013.01); *H01L 21/67144* (2013.01); *H01L 21/681* (2013.01); *H05K 13/0419* (2018.08)

(58) Field of Classification Search
CPC ......... H01L 21/67132; H01L 21/67144; H01L 21/67259; H01L 21/681; H05K 13/0419
See application file for complete search history.

(56) References Cited

U.S. PATENT DOCUMENTS

| | | | |
|---|---|---|---|
| 4,667,402 | A | 5/1987 | Wilde |
| 4,990,051 | A | 2/1991 | Safabakhsh et al. |

(Continued)

FOREIGN PATENT DOCUMENTS

| | | | |
|---|---|---|---|
| DE | 19822512 | A1 | 10/1999 |
| DE | 10349847 | B3 | 5/2005 |

(Continued)

*Primary Examiner* — Minh N Trinh
(74) *Attorney, Agent, or Firm* — John A. Miller; Shumaker, Loop & Kendrick LLP (57) ABSTRACT

The invention relates to an inspection unit intended for use in devices for transferring electronic components from a first substrate to a second substrate and/or for applying adhesive from a reservoir to the second substrate, comprising an image capturing unit, which is assigned an illumination unit, wherein the illumination unit is designed to direct light of different wavelengths onto a second holder, which in turn is designed to support an object located on the second substrate, which is to be captured by the image capturing unit, wherein a sixteenth, seventeenth, eighteenth and/or nineteenth conveying unit is designed to convey the respective image capturing unit and/or its associated optics, including focussing optics, a beam deflector and/or an illumination unit, along the second holder.

8 Claims, 3 Drawing Sheets

(56) References Cited

U.S. PATENT DOCUMENTS

| | | | |
|---|---|---|---|
| 6,166,393 A * | 12/2000 | Paul | G01N 21/8806 |
| | | | 250/559.46 |
| 6,201,306 B1 | 3/2001 | Kurosawa et al. | |
| 7,042,580 B1 | 5/2006 | Stanke et al. | |
| 2002/0019074 A1 | 2/2002 | Nakazawa et al. | |
| 2003/0161711 A1 | 8/2003 | Kwan | |
| 2006/0013680 A1 | 1/2006 | Haba et al. | |
| 2006/0237142 A1 | 10/2006 | Park et al. | |
| 2007/0293022 A1 | 12/2007 | Ko et al. | |
| 2008/0086874 A1 | 4/2008 | Cheung et al. | |
| 2009/0187354 A1 | 7/2009 | Ooyama et al. | |
| 2009/0242124 A1 | 10/2009 | Konno et al. | |
| 2009/0269178 A1 | 10/2009 | Trinks | |
| 2011/0063606 A1 * | 3/2011 | Babiarz | H01L 21/67126 |
| | | | 356/237.1 |
| 2016/0308269 A1 | 10/2016 | Marinov | |
| 2016/0365267 A1 | 12/2016 | Kakutani et al. | |
| 2021/0313206 A1 * | 10/2021 | Schmid | H01L 21/67259 |

FOREIGN PATENT DOCUMENTS

| | | |
|---|---|---|
| DE | 102008018586 A1 | 11/2009 |
| DE | 102010053912 A1 | 6/2012 |
| DE | 102011017218 A1 | 10/2012 |
| DE | 102011104225 A1 | 12/2012 |
| DE | 102015013494 B3 | 4/2017 |
| DE | 102015013495 A1 | 4/2017 |
| DE | 102011104225 B4 | 8/2017 |
| EP | 0140126 A1 | 5/1985 |
| EP | 0565781 B1 | 11/1995 |
| EP | 0949662 A2 | 10/1999 |
| EP | 2764826 A1 | 8/2014 |
| EP | 2491583 B1 | 11/2017 |
| JP | S5267451 A | 6/1977 |
| JP | S53100765 A | 9/1978 |
| JP | S5570041 A | 5/1980 |
| JP | S6097634 A | 5/1985 |
| JP | H01109737 A | 4/1989 |
| JP | H09162204 A | 12/1995 |
| JP | 2002050670 A | 2/2002 |
| JP | 2003109979 A | 4/2003 |
| JP | 2003124700 B1 | 4/2003 |
| JP | 2008004936 A | 1/2008 |
| JP | 2009238881 A | 10/2009 |
| JP | 2010161155 A | 7/2010 |
| TW | 201508846 A | 3/2015 |
| TW | 201724319 A | 7/2017 |
| TW | 201826434 A | 7/2018 |
| WO | 2000014789 A1 | 3/2000 |
| WO | 2002054480 A1 | 7/2002 |
| WO | 2007137888 A1 | 12/2007 |
| WO | 2017076989 A1 | 5/2017 |
| WO | WO-2020043612 A1 * | 3/2020 ....... H01L 21/67132 |

* cited by examiner

INSPECTION UNIT OF A TRANSFER DEVICE FOR TRANSFERRING COMPONENTS BETWEEN SUBSTRATES

CROSS-REFERENCE TO RELATED APPLICATIONS

This application is a National Stage application of International Application No. PCT/EP2019/072577 filed on Aug. 23, 2019 which claims priority to German Patent Application Serial No. DE 10 2018 006 760.3 filed Aug. 27, 2018.

BACKGROUND

Field

Described here are an inspection when transferring electronic components from a first substrate to a second substrate and a device and a method for applying adhesive to the second substrate. In particular, a device and a method are described for inspecting (before or after) when an electronic component is separated from the first substrate and transferred directly to the second substrate, (before or after) after adhesive was applied to the second substrate.

Discussion of the Related Art

When transferring electronic components, in particular chips (or "dies") and in particular when transferring singulated electronic components, the problem generally exists that these can easily be damaged and must therefore be handled with great care. In addition, electronic components are subject to continuous miniaturization, so that the requirements with regard to precision when transferring the electronic components are increasing continuously.

WO2017/076989 A1 relates to a processing system and method for processing a flexible substrate, for example a web, using a tensioner with a vacuum plate that is movable along a transport direction of the flexible substrate with an indexer, which moves the flexible substrate intermittently for processing. The vacuum plate is configured to be moved along the transport direction. An indexer is configured to move the flexible substrate intermittently for processing. A controller is configured to control the tensioner and the indexer such that a relative speed between the indexer and the vacuum plate of the tensioner is maintained above a predetermined threshold under all working conditions, even when the flexible substrate is stopped. The web that can be used in the processing system has a number of electrical structures, which are separated from one another by a distance. These electrical structures can be any type of flexible electronics.

DE 10 2011 104 225 B4 relates to a device for positioning electronic components to be transferred relative to an ejection device, with the ejection device, which has a slide for at least one electronic component and a housing enclosing the slide, the housing having a first light-permeable area. A first substrate provides the electronic components to be transferred. The first substrate has a first side facing the ejection device and a second side facing away from the ejection device. A plurality of electronic components is provided on the second side. An image data acquisition device is designed to acquire image data of a region, in which the slide is designed to interact with the at least one electronic component, through the first light-permeable area of the housing. A controller is designed to determine position data of the electronic component to be transferred from the acquired image data and to generate control commands based on the position data. At least one actuator is designed to move the first substrate and the ejection device relative to one another based on the control commands in order to change an offset between a longitudinal axis of the slide and a central axis of the electronic component to be transferred, wherein the ejection device comprises a first mirror arranged in the interior of the housing.

DE 103 49 847 B3 relates to a positioning device and a positioning method for the transfer of electronic components. Here a semiconductor wafer arranged on a carrier film is arranged above and parallel to a web-like substrate. The wafer can be moved within the wafer plane by means of a wafer holder and additionally rotated about an axis of rotation perpendicular to the wafer plane. An ejection device comprises a push-out needle, which acts by means of a downward movement on the rear side of a chip to be detached and detaches this from the carrier film. The chip detached from the carrier film is placed thereby onto a bonding position on the web-like substrate.

JP 2003-109979 A relates to a device with at least two slides for separating out components from a first substrate. Here the components are each taken up by a suction pipette of a transfer element. In a last step, the transfer element with suction pipettes and components is positioned above a second substrate, which has already been prepared with adhesive, and the components are placed onto the second substrate. In this case the components are not directly transferred from the first substrate to the second substrate, but are received following the separation from the first substrate by means of a transfer element, and are oriented exactly by the transfer element in a following step and attached to the second substrate.

The document U.S. Pat. No. 7,042,580 B1 relates to a device for the optical measurement of electronic components, which device can be integrated into a process station. The device is physically spaced at a distance from the process station in this case but is coupled electronically to this. The device for the optical measurement of electronic components comprises a camera sensor, which is directed onto a measuring area and can be moved by means of a conveying unit.

Document DE 10 2015 013 495 A1 discloses a device for transferring electronic components from a wafer to a substrate, wherein the electronic components are inspected during the transfer process from different directions using optically detecting sensors.

Document DE 10 2011 104 225 A1 discloses a device for positioning electronic components to be transferred relative to an ejection device. Here the ejection device has a slide for at least one electronic component and a housing enclosing the slide, the housing having a first light-permeable area. The electronic components to be transferred are provided by a first substrate, which comprises a first side facing the ejection device and a second side facing away from the ejection device, wherein a plurality of the electronic components is provided on the second side. At least one image data acquisition device is designed here to acquire image data of a region, in which the slide is designed to interact with the at least one electronic component, through the first light-permeable area of the housing. A controller is designed to determine position data of the electronic component to be transferred from the acquired image data and to generate control commands based on the position data; and at least one actuator is designed to move the first substrate and the ejection device relative to one another based on the control commands in order to change an offset between a longitudinal axis of the slide and a central axis of the electronic component to be transferred.

SUMMARY

Against this background, an arrangement and a procedure are required with which the throughput when transferring components from the first to the second substrate is to be increased with a high level of accuracy and reproducibility. It should also be possible to use second substrates that are barely transparent to completely untransparent without any loss of quality in the positional accuracy of the component assembly. Finally, the components should be handled carefully.

To achieve this object, a device is proposed for transferring electronic components from a first substrate to a second substrate, wherein
the first substrate carries a plurality of singulated components detachably therefrom, and
the second substrate is configured to be practically endless and carries a plurality of electronic sub-assemblies in its longitudinal and transverse extension, to which sub-assemblies respectively one of the components is to be transferred from the first substrate, and wherein the device comprises:
a first holder, which is designed to hold the first substrate;
a second holder, which is designed for the purpose of carrying the second substrate along its longitudinal extension in a conveying direction of the second substrate; wherein
the first holder is designed to hold the first substrate such that the components supported by it are oriented towards the second holder;
a separation unit, which is designed to separate the components from the first substrate with or without contact to transfer them to the second substrate;
a first conveying unit, which is provided and designed to move the first holder transversely to the conveying direction of the second substrate relative to the second holder;
a second conveying unit, which is provided and designed to move the separation unit transversely to the conveying direction of the second substrate relative to the second holder;
a first inspection unit, which is provided and designed to detect at least one of the components in its position relative to an assembly position on the second holder carrying the second substrate;
a second inspection unit, which is arranged upstream of the assembly position and is provided and designed to detect at least one of the plurality of electronic sub-assemblies on the second substrate in its position relative to the second holder, and to signal information representing the detected position to a controller;
a third conveying unit, which is provided and designed to convey, in response to information signaled by the controller, the second substrate in its position relative to the assembly position such that the at least one of the plurality of electronic sub-assemblies on the second substrate reaches the assembly position on the second holder carrying the second substrate.

Hitherto, for the assembly of sub-assemblies or lead frames by means of direct die assembly (DDA), single-row web material has normally been used as the second substrate on which the components from the first substrate are placed. The solution presented permits multi-row web material to be used as the second substrate. The reduced complexity and higher throughput of the direct die arrangement are thereby transferred to the area of systems that are capable of processing multi-row web material. Multi-row web material is conventionally fitted with components in so-called pick-and-place systems or so-called flip-chip systems. The solution proposed here also permits replacement of the previous inspection of the second substrate at the assembly position. Even barely transparent to completely untransparent second substrates can thus be used without any loss of quality in the component assembly.

Conventional systems that are designed to process multi-row web material normally work with bond heads, which receive the component in an area outside the web material, position it in an X/Y-direction to the assembly positions on the web material and then place it onto the web material in the Z-direction.

To recognize the assembly position on the web material before die assembly, conventional DDA systems for single-row web material use a camera, which is mounted directly in the assembly area on the rear/underside of the web material of the second substrate. Due to this arrangement, conventional DDA systems can only process completely transparent materials, e.g. PET, without limiting the assembly precision, untransparent materials not generally being possible as second substrates.

The proposed solution detects the assembly position on the web material (spatially/timewise) before the actual component assembly, wherein the second inspection unit detects the respective component assembly point directly on the second substrate itself, thus not through the second substrate. The second substrate is then conveyed under control to the assembly position such that the component assembly point aligns as precisely as possible with the position of the component to be assembled on the first substrate when the separation unit separates this component from the first substrate and this is then transferred in the Z-direction to the second substrate.

Compared with pick-and-place systems or flip-chip systems, a significantly higher throughput of components can be achieved with the proposed solution on account of its structurally lower complexity. Here the components can be directly separated individually from the (sawn) wafer and placed into the respective sub-assembly (or lead frame or similar) on the second substrate; an intermediate substrate as on conventional placement machines is no longer necessary. The transparency of the material of the second substrate no longer has any influence on the positional accuracy during assembly of the component.

In one variant, the first holder with the first substrate is located directly above the second substrate on the second holder. In contrast to previous solutions, the first holder and the separation unit have a movement space transverse to the conveying direction of the second substrate that corresponds at least approximately to the width of the second substrate. The working/component assembly area is thereby increased significantly over the width of the second substrate. Several adjacent rows of electronic sub-assemblies, for example RFID antennas, on a wide second substrate can therefore be reached by the first substrate and can be assembled at the assembly position by operation of the separation unit.

In one variant, the first substrate has a first side facing the separation unit and a second side facing away from the separation unit and facing the second substrate on/at the second holder, wherein the plurality of components is mounted detachably on the second side of the first substrate; the first inspection unit is designed to capture image data of a region in which the separation unit is designed to interact with or without contact with at least one of the components, in order to separate this from the first substrate; and the controller is designed to determine, from the image data captured, position data of the component to be transferred and to generate control commands for the separation unit and the respective conveying units based on the position data.

In one variant, the second inspection unit is arranged—with regard to the conveying direction of the second substrate—upstream of the assembly position at the second substrate and is provided and designed to detect, transversely to the conveying direction of the second substrate, one or more of the plurality of electronic sub-assemblies respectively on the second substrate in their position relative to the second holder, and to signal information representing the position detected to the controller.

In one variant, a first sensor unit is associated with the third conveying unit, which sensor unit is provided and designed to signal to the controller information on the conveying direction and conveying path of the second substrate relative to the assembly position.

In one variant, the controller is provided and designed to control the second conveying unit, based on the information of the second inspection unit regarding the position of the at least one electronic sub-assembly and the information regarding the conveying direction and conveying path of the second substrate, as well as based on the information of the first inspection unit regarding the position of at least one of the components relative to the assembly position, in order to move the separation unit transversely to the conveying direction of the second substrate to the assembly position and to activate the separation unit for the purpose of separating the component from the first substrate.

In one variant, the device comprises a fourth conveying unit, which is provided and designed to move the first holder along the conveying direction of the second substrate relative to the second holder in response to information signaled by the controller; and/or a fifth conveying unit, which is provided and designed to rotate the first holder about an angle (theta) relative to the second holder in response to information signaled by the controller.

In another variant, the device comprises a sixth conveying unit, which is provided and designed to convey the second substrate, in response to information signaled by the controller, in such a way (slip-free and thus free of elongation) along the conveying direction via the second holder that the at least one of the plurality of electronic sub-assemblies on the second substrate reaches the assembly position on the second holder carrying the second substrate.

In another variant of the device, the separation unit, if it is designed to separate the components from the first substrate with contact, comprises a push pin, which is designed and dimensioned to puncture the first substrate in response to information signaled by the controller in order to detach one of the components from the first substrate in each case and transfer it to the second substrate; or if it is designed to separate the components contactlessly from the first substrate, the separation unit comprises a controllable energy source, which is designed and dimensioned to charge the first substrate with energy in response to information signaled by the controller in order to detach one of the components respectively from the first substrate and transfer it to the second substrate.

In another variant of the device, the second holder comprises a (circular) cylindrical drum or a convexly curved surface, via which the second substrate reaches the assembly position on the second holder, wherein in one variant the second holder has outlets on its shell/surface carrying the second substrate, which outlets are designed to hold the second substrate on the second holder (slip-free and free of elongation) by means of a vacuum.

In another variant, the device comprises a third inspection unit, which is arranged—with regard to the conveying direction of the second substrate—downstream of the assembly position and is provided and designed to detect at least one of the plurality of electronic sub-assemblies on the second substrate and the component transferred to it in their position relative to one another, and to signal information representing the detected position to the controller.

In another variant, the device comprises an eighth conveying unit, which is provided and designed to convey the second inspection unit relative to the second holder and the assembly position, in order to detect at least one component assembly point on the second substrate by the second inspection unit and/or to detect at least one of the plurality of electronic sub-assemblies on the second substrate in its position and to signal information representing the position detected to the controller; and/or a ninth conveying unit, which is provided and designed to convey the third inspection unit relative to the second holder and the assembly position, in order to detect at least one of the plurality of electronic sub-assemblies on the second substrate and the component transferred to it in their position relative to one another, and to signal information representing the position detected to the controller.

Alternatively, the second and/or the third inspection unit are supported pivotably on the second holder and are adjustable under electronic control or manually in their orientation to the component assembly point or the electronic sub-assemblies on the second substrate and the component transferred to them.

To achieve this object, another device is also proposed for applying adhesive from a reservoir to a second substrate, wherein the second substrate is configured to be practically endless and in its longitudinal and transverse extension supports a plurality of electronic sub-assemblies to which the adhesive is to be applied, in order thereafter to transfer a component to one of the sub-assemblies, and wherein the other device comprises: a third holder, which is designed for the purpose of carrying the second substrate along its longitudinal extension in a conveying direction of the second substrate; a dispensing unit for adhesive, which is designed to output adhesive in a controlled and metered manner towards the third holder onto a bonding point on the second substrate at an adhesive application position at which one of the plurality of electronic sub-assemblies is located; an eleventh conveying unit, which is provided and designed to move the dispensing unit for adhesive transversely to the conveying direction of the second substrate relative to the third holder; a fourth inspection unit, which is arranged upstream of the adhesive application position and is provided and designed to detect at least one of the plurality of electronic sub-assemblies on the second substrate in its position relative to the third holder, and to signal information representing the position detected to the controller; a twelfth conveying unit, which is provided and designed to convey the second substrate, in response to information signaled by the controller, in its position relative to the adhesive application position in such a way that the at least one of the plurality of electronic sub-assemblies with the bonding point on the second substrate reaches the adhesive application position on the third holder carrying the second substrate.

The device for applying adhesive is advantageously in interaction with and upstream of the device for transferring electronic components from a first substrate to a second substrate but is also to be used independently thereof.

It is the case with regard to the device for applying adhesive also that it permits the use of multi-row web material as the second substrate, wherein the reduced complexity and the higher throughput during adhesive application are transferred to the area of systems that are capable of processing multi-row web material. The solution proposed here for adhesive application also permits replacement of the previous inspection of the second substrate at the adhesive application position. Even barely transparent to completely untransparent second substrates can thus be used without any loss of quality when applying adhesive before component assembly.

To recognize the adhesive application position on the web material before the adhesive application, conventional DDA systems for single-row web material use a camera, which is mounted directly in the assembly area on the rear/underside of the web material of the second substrate. Due to this arrangement, conventional DDA systems can only process completely transparent materials, e.g. PET, without limiting the assembly precision, untransparent materials not generally being possible as a second substrate.

The proposed solution detects the bonding point on the web material (spatially/timewise) before the actual adhesive application, wherein the fourth inspection unit detects the respective bonding point—in connection with the respective electronic sub-assembly—directly on the second substrate itself, thus not through the second substrate. The second substrate is then conveyed in a controlled manner to the adhesive application position in such a way that the bonding point aligns as precisely as possible with the position of the outlet of the dispensing unit for adhesive when the dispensing unit outputs (meters a portion) of adhesive onto the bonding point In one variant, the fourth inspection unit, which is arranged—with regard to the conveying direction of the second substrate—upstream of the adhesive application position at the second substrate, is provided and designed to detect, transversely to the conveying direction of the second substrate, one or more respectively of the plurality of electronic sub-assemblies on the second substrate in their position relative to the third holder, and to signal information representing the position detected to the controller.

In one variant, a second sensor unit is associated with the twelfth conveying unit, which sensor unit is provided and designed to signal information to the controller regarding the conveying direction and conveying path of the second substrate relative to the adhesive application position.

In one variant, the controller is provided and designed to control the eleventh conveying unit, based on the information of the fourth inspection unit regarding the position of the at least one electronic sub-assembly and the information regarding the conveying direction and conveying path of the second substrate, as well as on the basis of the information of the fourth inspection unit regarding the position of at least one of the components relative to the adhesive application position, in order to move the dispensing unit transversely to the conveying direction of the second substrate to the assembly position, and to activate the dispensing unit for the purpose of separation of the component from the first substrate.

In one variant, the device comprises a thirteenth conveying unit, which is provided and designed to convey the second substrate, in response to information signaled by the controller, in such a way (slip-free and thus free of elongation) along the conveying direction via the second holder that the at least one of the plurality of electronic sub-assemblies on the second substrate reaches the adhesive application position on the second holder carrying the second substrate.

In another variant of the device, the third holder comprises a (circular) cylindrical drum or a convexly curved surface, via which the second substrate reaches the assembly position on the third holder, wherein in one variant the second holder has outlets on its shell/surface carrying the second substrate, which outlets are designed to hold the second substrate on the third holder (slip-free and free of elongation) by means of a vacuum.

In another variant, the device comprises a fifth inspection unit, which is arranged—with reference to the conveying direction of the second substrate—downstream of the adhesive application position and is provided and designed to detect at least one of the plurality of electronic sub-assemblies on the second substrate and the adhesive applied to it in their position relative to one another, and to signal information representing the detected position to the controller.

In another variant, the device comprises a fourteenth conveying unit, which is provided and designed to convey the fourth inspection unit relative to the third holder and the adhesive application position, in order to detect at least one bonding point on the second substrate by the fifth inspection unit, to detect at least one of the plurality of electronic sub-assemblies on the second substrate in its position and to signal information representing the position detected to the controller; and/or a fifteenth conveying unit, which is provided and designed to convey the fifth inspection unit relative to the third holder and the adhesive application position, in order to detect at least one of the plurality of electronic sub-assemblies on the second substrate and the adhesive applied to it in their position relative to one another, and to signal information representing the position detected to the controller.

Alternatively, the fourth and/or the fifth inspection unit are supported pivotably and are adjustable in their orientation under electronic control or manually.

In the devices described above for transferring electronic components from a first substrate to a second substrate and/or for applying adhesive from a reservoir to a second substrate, the second to fifth inspection units can be configured as follows. Associated with an image capturing unit is an illumination unit, wherein the illumination unit is designed to direct light of different wavelengths onto a second holder, which is designed to support an object located on the second substrate that is to be captured by the image capturing unit, a sixteenth, seventeenth, eighteenth and/or nineteenth conveying unit is designed to convey the respective image capturing unit with its associated illumination unit along the second holder, and an eighth, ninth, fourteenth and/or fifteenth conveying unit is provided and designed to convey the respective second, third, fourth and/or fifth inspection unit relative to the respective second and/or third holder and the component assembly position or the adhesive application position along the conveying direction of the second substrate.

In one variant of the inspection unit, the illumination unit comprises a white light source, an (infra-)red light source and/or an (ultra)-blue light source.

In one variant of the illumination unit, the (infra-)red light source and/or the (ultra-) blue light source is configured as a ring light source, which at least partially encloses a capture area of the image capturing unit.

In one variant of the inspection unit, the white light source is arranged on a side, remote from the capture area of the image capturing unit, of an at least partially light-permeable beam deflector.

In one variant of the inspection unit, the image capturing unit comprises focusing optics, which are arranged at a distance, which can be set fixedly, from the side of an at least partially light-permeable beam deflector facing the optics.

Even if some of the aspects described above were described with reference to the mode of operation of the device, these aspects can also relate to the structure of the device. In exactly the same way, the aspects described above with reference to the device can apply correspondingly to the mode of operation. Although the individual aspects of the device and the mode of operation are described in association, so as to explain their interaction, they are also disclosed independently of one another, of the other devices and other modes of operation.

BRIEF DESCRIPTION OF THE DRAWINGS

Further objectives, features, advantages, and application possibilities result from the following description of exemplary embodiments, which are not to be understood as restrictive, with reference to the associated drawings. Here all features described and/or depicted show by themselves or in any combination the subject matter disclosed here, even independently of their grouping in the claims or their references. The dimensions and proportions of the components shown in the figures are not necessarily to scale in this case; they may diverge from what is shown here in embodiments to be implemented.

The method and device variants described here, and their functional and operational aspects serve only for a better understanding of their structure, mode of operation and properties; they do not restrict the disclosure to the exemplary embodiments. The figures are partly schematic, wherein substantial properties and effects are depicted significantly enlarged in part to clarify the functions, active principles, technical configurations, and features. Each mode of operation, each principle, each technical configuration and each feature that is/are disclosed in the figures or in the text can be freely combined in any way with all claims, each feature in the text and in the other figures, other modes of operation, principles, technical configurations and features that are contained in this disclosure or result from it, so that all conceivable combinations are to be associated with the devices described. Combinations between all individual implementations in the text, meaning in each section of the description, in the claims and even combinations between different variants in the text, in the claims and in the figures are also comprised in this case and can be made the subject matter of other claims. Nor do the claims limit the disclosure and thus the combination possibilities of all features shown with one another. All disclosed features are explicitly disclosed here also individually and in combination with all other features.

DETAILED DESCRIPTION OF THE EMBODIMENTS

In the figures, components corresponding to one another or similar in function are provided with corresponding reference signs. The method and the device are now described on the basis of exemplary embodiments.

Figure 1:
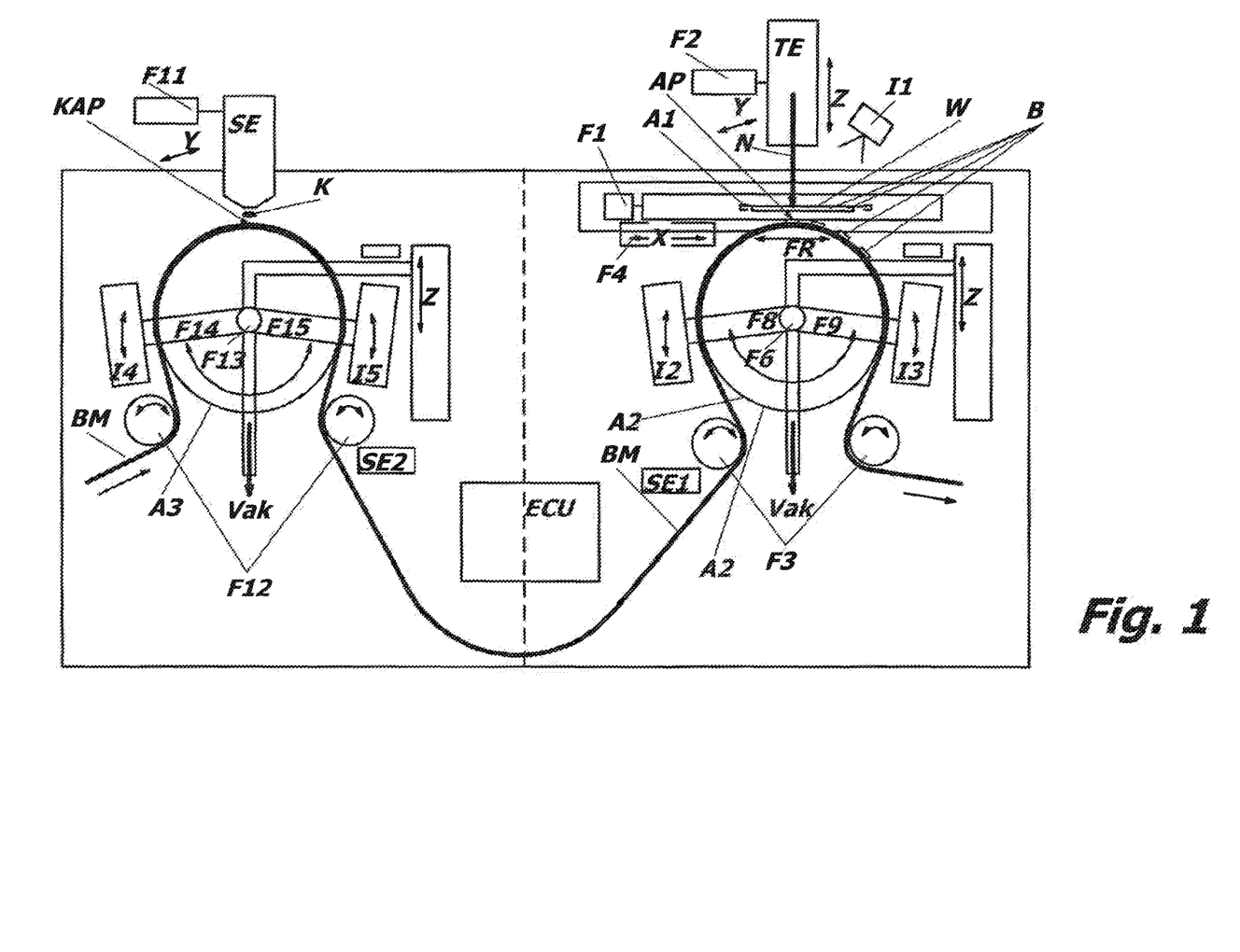
FIG. 1 shows a schematic, lateral plan view of the device for transferring electronic components from a first substrate to a second substrate and a device for applying adhesive to the second substrate.

FIG. 1 shows (on the right-hand side) a device 100 for transferring electronic components B from a first substrate W to a second substrate BM. In this variant, the first substrate W has the design of a roughly circular semiconductor component wafer here and supports a plurality of singulated components B, which are detachable from it in the manner described further below. The second substrate BM is configured as practically endless web material and supports a plurality of electronic sub-assemblies ANT in its longitudinal and transverse extension. In the variant shown here, the sub-assemblies ANT are printed antenna sections of an RFID module. One of the components B from the first substrate W is to be transferred respectively to each of the plurality of electronic sub-assemblies ANT. The device has a first holder A1, which is designed to hold the first substrate W. The first holder A1 is adapted in its design to the first substrate W.

A second holder A2 has the form of a circular cylindrical drum in the variant shown. The second substrate BM is carried via the cylinder-jacket-shaped outer wall along its longitudinal extension in a conveying direction FR. Details of this are explained further below. The first holder A1 holds the first substrate W such that the components B supported by it are oriented towards the second holder A2. On the side of the first holder A1 remote from the second holder A2, a separation unit TE is provided. The first substrate W has a first side facing the separation unit TE and a second side facing away from the separation unit that faces the second substrate BM on/at the second holder A2. Mounted detachably on the second side of the first substrate W is the plurality of components B. The separation unit TE serves to separate the components B from the first substrate W with or without contact, to transfer them to the second substrate BM at an assembly position AP.

The first holder A1 is part of a table, which is adjustable in X-/Y/theta coordinates and of which individual X-/Y-axes and rotary position theta are each to be adjusted by a conveying unit controlled by an electronic controller ECU. In particular, a first conveying unit F1 in the form of a linear servo drive is provided and designed to move the first holder A1 transversely to the conveying direction FR of the second substrate BM relative to the second holder A2. (See also FIG. 2). A second conveying unit F2 in the form of a linear servo drive is provided and designed to move the separation unit TE transversely to the conveying direction FR of the second substrate BM relative to the second holder A2.

A first inspection unit I1 in the form of a camera is associated with the separation unit TE and serves to detect at least one of the components B in its position relative to an assembly position AP on the second holder A2 carrying the second substrate BM.

A second inspection unit I2 is arranged upstream of the assembly position AP and associated with the second holder A2. This second inspection unit I2 can both be moved in a controlled manner in longitudinal extension of the drum-shaped second holder A2, thus transversely to the conveying direction FR of the second substrate BM, and be adjusted manually or by motor by a predetermined angular amount along the circumference on the shell surface of the drum-shaped second holder A2. For example, the inspection unit I2 can be connected to the second holder A2 via a pivot arm.

The second inspection unit I2 serves to detect at least one of the plurality of electronic sub-assemblies ANT on the second substrate BM in its position relative to the second holder A2, and to signal information representing the position detected to a controller ECU. A third conveying unit F3 is formed in this configuration by two transport rollers to be driven under control, which are arranged up- and downstream of the drum-shaped second holder A2 and about which the second substrate BM is guided. In response to information signaled by the controller ECU, the second substrate BM is conveyed by the two transport rollers to be driven under control in such a way in its position relative to the assembly position AP that the at least one of the plurality of electronic sub-assemblies ANT on the second substrate BM reaches the assembly position AP on the second holder A2 carrying the second substrate BM.

Let it be understood here that the assembly position AP changes both in the longitudinal direction of the second substrate BM and in its transverse extension according to which sub-assembly ANT on the second substrate BM is to be fitted with a component B, while a corresponding area of the second substrate BM is located on the second holder A2 and is to be brought into alignment with the first substrate W. Accordingly the first substrate W is also to be moved, controlled by the controller ECU, both in the longitudinal direction of the second substrate BM and in its transverse extension.

Multi-row web material can evidently be used as a second substrate. This can be understood to be web material that supports several rows of subassemblies ANT in its transverse extension. Substrate material that is barely transparent to completely untransparent can be used as the second substrate BM without any loss of accuracy in component assembly.

The assembly position AP on the web material of the second substrate BM is detected spatially/timewise before the actual component assembly. In this case the second inspection unit I2 directly detects the respective component assembly point on the second substrate BM itself, thus not through the second substrate. The second substrate BM is then conveyed in a controlled manner to the assembly position AP such that the component assembly point aligns as precisely as possible with the position of the component to be assembled on the first substrate W when the separation unit TE separates this component B from the first substrate W and this is then transferred in the Z-direction to the second substrate BM.

The first holder A1 with the first substrate W is located directly above the second substrate BM on the second holder A2. Here the first holder A1 and the separation unit TE have a movement space transversely to the conveying direction FR of the second substrate BM that corresponds at least approximately to the width of the second substrate BM. (See FIG. 2). The working/component assembly area thereby extends approximately over the width of the second substrate BM. In one variant, the movement space of the holder A1 and/or the separation unit TE transversely to the conveying direction FR of the second substrate BM can be greater than the transverse extension of the second substrate BM, so that at least the first substrate W can be positioned approximately completely or at least the center/center line of the first substrate W can be positioned beyond the transverse extension of the second substrate BM. Several adjacent rows of electronic sub-assemblies ANT, for example RFID antennas, can therefore be reached on a broad second substrate BM with the first substrate W and can be assembled at the assembly position AP by operating the separation unit TE.

The first inspection unit I1 is designed to capture image data of a region in which the separation unit TE is designed to interact with or without contact with at least one of the components B to separate this from the first substrate W.

The controller ECU is designed to determine position data of the component B to be transferred from the captured image data and to generate control commands for the separation unit TE and the respective conveying units F1, . . . Fn based on the position data.

The second inspection unit I2 is arranged with reference to the conveying direction X of the second substrate BM on the upstream side of the assembly position AP at the second substrate A2 and is provided and designed to detect, transversely to the conveying direction X of the second substrate BM, one or more respectively of the plurality of electronic sub-assemblies ANT on the second substrate BM in their position relative to the second holder, and to signal information representing the position detected to the controller ECU.

Associated with the third conveying unit F3 is a first sensor unit SE1, which is provided and designed to signal information to the controller ECU about the conveying direction and conveying path of the second substrate BM relative to the assembly position AP.

Based on the information of the second inspection unit I2 regarding the position of the at least one electronic sub-assembly ANT and the information regarding the conveying direction and conveying path of the second substrate BM, as well as on the basis of the information of the first inspection unit I1 regarding the position of at least one of the components B relative to the assembly position AP, the controller ECU serves to control the second conveying unit F2. The controller ECU thus causes the separation unit TE to be moved (in the conveying direction and) transversely to the conveying direction X of the second substrate BM to the assembly position AP, and the separation unit TE is activated for the purpose of separating the component B from the first substrate W.

A fourth conveying unit F4 serves to move the first holder A1 along the conveying direction FR of the second substrate BM relative to the second holder A2 in response to information signaled by the controller ECU.

Overall, each component B of the first substrate W can be positioned in this way by corresponding control of the appropriate X-/Y-drives of the conveying units F1, F4 within a double-dotted and dashed area AF for transferring a component B to the second substrate BM on the second holder A2. The double-dotted and dashed area AF can be larger in the transverse extension of the second substrate BM in one variant than the transverse extension of the second substrate BM.

A fifth conveying device F5 serves to rotate the first holder A1 about an angle theta relative to the second holder A2 in response to information signaled by the controller ECU.

A sixth conveying unit F6 can rotate the second holder A2 in and against the conveying direction FR in a controlled manner in response to information signaled by the controller ECU. It serves to convey the second substrate BM slip-free and free of elongation along the conveying direction FR via the second holder A2 such that the at least one of the plurality of electronic sub-assemblies ANT on the second substrate BM reaches the respective assembly position AP on the second holder A2 carrying the second substrate BM.

In one variant, the separation unit TE is designed to separate the components B from the first substrate W with contact. To this end it has a push pin N, which is designed and dimensioned to puncture the first substrate W (from above in FIG. 1) in response to information signaled by the controller ECU, in order to detach one of the components B in each case from the first substrate W and transfer it to the second substrate BM. In a second variant, it is designed to separate the components B contactlessly from the first substrate W. To this end the separation unit TE has a controllable energy source, which is designed and dimensioned to charge the first substrate W with laser energy, for example, in response to information signaled by the controller ECU, in order to detach one of the components B in each case from the first substrate W and transfer it to the second substrate BM.

The second holder A2 is a circular cylindrical drum or a convexly curved surface, via which the second substrate BM reaches the assembly position AP on the second holder A2. In one variant, the second holder A2 has a plurality of small outlets on its shell/surface carrying the second substrate BM, so as to hold the second substrate BM slip-free and free of elongation on the second holder A2 by means of a vacuum Vak.

In one variant, the shell/surface of the second holder can be designed or the vacuum Vak can be controllable such that no vacuum Vak is present on the shell/surface underneath the assembly position, but only on the upstream and downstream side of the assembly position AP. The second substrate BM is thus held by a vacuum upstream and downstream of the assembly position AP; there is no vacuum at the assembly position.

In one variant, the second holder A2 can be moved by a conveyor unit in the Z-direction towards the first holder A1 and away from the first holder A1 to set a distance between the first and second holder.

In another variant, the second holder A2 and/or the third holder A3 can have compressed air introduced at least at one part of the respective area at which the second substrate BM does not rest on the respective holder A2 or A3, which compressed air exits through the openings in order to blow out dirt sucked into the vacuum holes over time.

A third inspection unit I3 is arranged with reference to the conveying direction FR of the second substrate BM downstream of the assembly position AP at the second holder A2. It serves to detect at least one of the plurality of electronic sub-assemblies ANT on the second substrate BM and the component B transferred to it in their position relative to one another, and to signal information representing the position detected to the controller ECU.

An eighth conveying unit F8 serves to convey the second inspection unit I2 relative to the second holder A2 and the assembly position AP in order to detect at least one component assembly point on the second substrate BM by the second inspection unit I2. The second inspection unit I2 is thus movable in a controlled manner both in longitudinal extension of the drum-shaped second holder A2, thus transversely to the conveying direction FR of the second substrate BM, and by a predetermined angular amount along the circumference on the shell surface of the drum-shaped second holder A2. Alternatively to this, the angle is set manually before operation commences.

At least one of the plurality of electronic sub-assemblies ANT on the second substrate BM can also be detected in its position in this way to signal information representing the position detected to the controller ECU. Furthermore, a ninth conveying unit F9 is provided in this variant to convey the third inspection unit I3 relative to the second holder A2 and the assembly position AP in a manner analogous to how this is carried out by the eighth conveying unit F8 for the second inspection unit I2. The third inspection unit I3 can thus detect at least one of the plurality of electronic subassemblies ANT on the second substrate BM and the component B transferred to it in their position relative to one another and can signal information representing the position detected to the controller ECU.

Another (sub-)device such as is illustrated in FIG. 1 on the lefthand side serves to apply adhesive K from a reservoir to a second substrate BM. As already mentioned, the second substrate BM is configured to be practically endless and in its longitudinal and transverse extension supports a plurality of electronic subassemblies ANT to which the adhesive K is to be applied, in order thereafter to transfer a component B to one of the sub-assemblies ANT. The other device comprises a third holder A3, which serves the purpose of carrying the second substrate BM along its longitudinal extension in a conveying direction FR of the second substrate BM.

A dispensing unit SE for adhesive K is provided in FIG. 1 above the third holder A3 to dispense adhesive K in a controlled and metered manner towards the third holder A3 onto a bonding point KS on the second substrate BM at an adhesive application position KAP, at which one of the plurality of electronic subassemblies ANT is located.

An eleventh conveying unit F11 serves to move the dispensing unit SE for adhesive K transversely to the conveying direction FR of the second substrate BM relative to the third holder A3. A fourth inspection unit I4 is associated with the third holder A3 and is arranged upstream of the adhesive application position KAP. The fourth inspection unit I4 serves to detect at least one of the plurality of electronic sub-assemblies ANT on the second substrate BM in its position relative to the third holder A3, and to signal information representing the position detected to the controller ECU.

A twelfth conveying unit F12 is formed in this configuration by two transport rollers to be driven under control, which are arranged respectively on the upstream and downstream side of the drum-shaped third holder A3, and around which the second substrate BM is guided. In response to information signaled by the controller ECU, the second substrate BM is conveyed by the two transport rollers to be driven under control in such a way in its position relative to the adhesive application position KAP that the at least one of the plurality of electronic sub-assemblies ANT with the bonding point KS on the second substrate BM reaches the adhesive application position KAP on the third holder A3 carrying the second substrate BM.

In the configuration shown here, the adhesive application device cooperates with the device for transferring components from a first substrate to a second substrate. To this end the device for adhesive application is used on the upstream side of the transfer device for components.

It is the case with regard to the device for adhesive application also that it permits the use of multi-row web material as the second substrate.

In the device, the bonding point is detected on the web material spatially/timewise before the actual adhesive application. Here a fourth inspection unit I4 detects the respective bonding point KS at the respective electronic subassembly on the second substrate BM itself directly, thus not through the second substrate BM. The second substrate BM is then conveyed in a controlled manner to the adhesive application position KAP so that the bonding point KS is aligned as precisely as possible with the position of the outlet of the dispensing unit SE for adhesive K when the dispensing unit dispenses a metered portion of adhesive K onto the bonding point KS.

The fourth inspection unit I4 is arranged—with reference to the conveying direction FR of the second substrate BM—upstream of the adhesive application position KAP on the circumference of the drum-shaped third holder A3 and serves to detect, transversely to the conveying direction FR of the second substrate BM, respectively one or more of the plurality of electronic sub-assemblies ANT on the second substrate BM in their position relative to the third holder A3, and to signal information representing the position detected to the controller ECU.

Associated with the twelfth conveying unit F12 is a second sensor unit SE2 to signal information to the controller ECU about the conveying direction and conveying path of the second substrate BM relative to the adhesive application position KAP.

Based on the information of the fourth inspection unit I4 regarding the position of the at least one electronic sub-assembly ANT and the information regarding the conveying direction and conveying path of the second substrate BM, as well as on the basis of the information of the fourth inspection unit I4 regarding the position of at least one of the components B relative to the adhesive application position KAP, the controller ECU serves to control the eleventh conveying unit F11 to move the dispensing unit SE transversely to the conveying direction FR of the second substrate BM.

A thirteenth conveying unit F13 serves to convey the second substrate BM along the conveying direction FR via the third holder A3 in response to information signaled by the controller ECU. Controlled by the controller ECU, this takes place so slip-free and so free of elongation that the at least one of the plurality of electronic sub-assemblies ANT on the second substrate BM reaches the adhesive application position KAP on the third holder A3 carrying the second substrate BM.

Comparable to the second holder A2, the third holder A3 is a circular cylindrical drum or a convexly curved surface via which the second substrate BM reaches the adhesive application position KAP on the third holder A3. Here, too, the second holder has outlets on its shell/surface carrying the second substrate BM, in order to hold the second substrate BM on the third holder A3 slip-free and free of elongation by means of the vacuum Vak.

A fifth inspection unit I5 is arranged with reference to the conveying direction FR of the second substrate BM downstream of the adhesive application position KAP on the circumference of the drum-shaped third holder A3 and serves to detect at least one of the plurality of electronic sub-assemblies ANT on the second substrate BM and the adhesive K applied to it in their position relative to one another, and to signal information representing the position detected to the controller ECU.

A fourteenth conveying unit F14 serves to convey the fourth inspection unit F4 relative to the third holder A3 and the adhesive application position KAP. The fourth inspection unit F4 can thus detect at least one bonding point KS on the second substrate BM, in order to detect at least one of the plurality of electronic sub-assemblies ANT on the second substrate BM in its position and to signal information representing the position detected to the controller ECU.

A fifteenth conveying unit F15 serves to convey the fifth inspection unit I5 relative to the third holder A3 and the adhesive application position KAP along the circumference of the third holder A3. The fifth inspection unit I5 can thus detect at least one of the plurality of electronic sub-assemblies ANT on the second substrate BM and the adhesive K applied to it in their position relative to one another and can signal information representing the position detected to the controller ECU.

Figure 2:
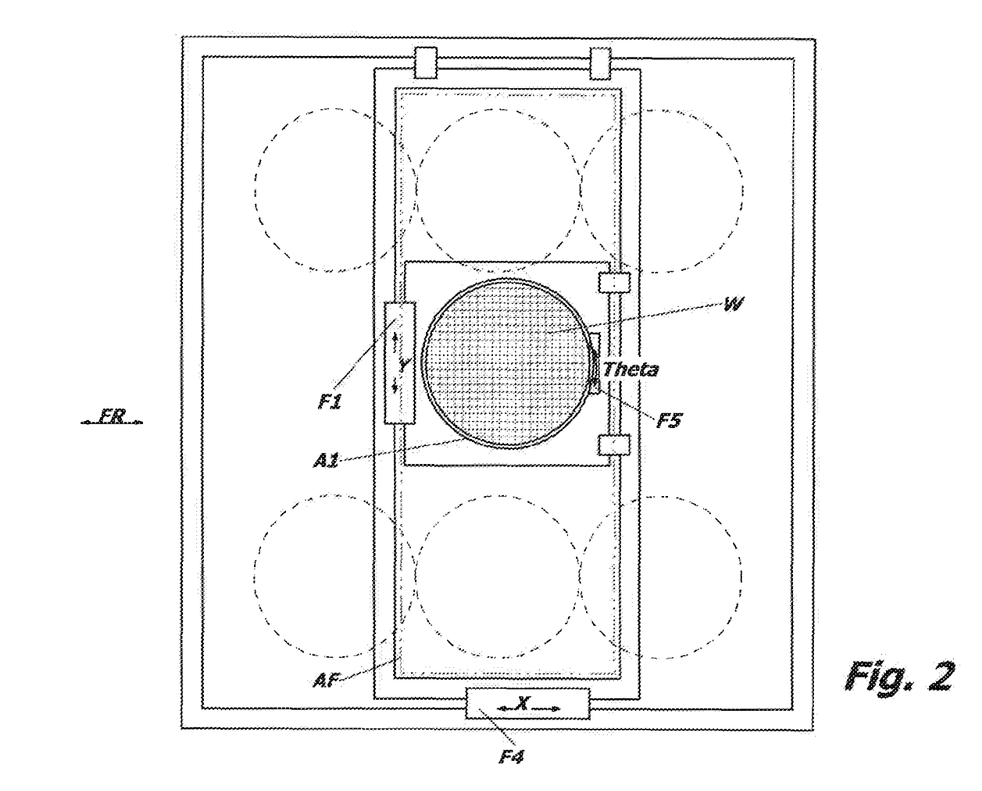
FIG. 2 shows a schematic plan view of a table adjustable in X-/Y-/theta coordinates.

The table adjustable in X-/Y-/theta coordinates according to FIG. 2 is configured in a particularly simple and advantageous manner as follows: the holder A1 holding the first substrate W is arranged on a first carrier plate, wherein the fifth conveying unit F5 serves to rotate the first holder A1 about an angle theta relative to the first carrier plate.

The first carrier plate is arranged movably on a second carrier plate in the transverse extension (Y) of the second substrate BM. The first conveying unit F1 is provided to move the first carrier plate and thus also the first holder A1 (exclusively) transversely to the conveying direction FR of the second substrate BM relative to the second carrier plate.

The second carrier plate is arranged movably on a rigid, third carrier plate or on a support frame in the conveying direction FR of the second substrate BM. The fourth conveying unit F4 is provided to move the first holder W, the first carrier plate and the second carrier plate (exclusively) in the conveying direction FR of the second substrate BM relative to the third carrier plate.

Figure 3:
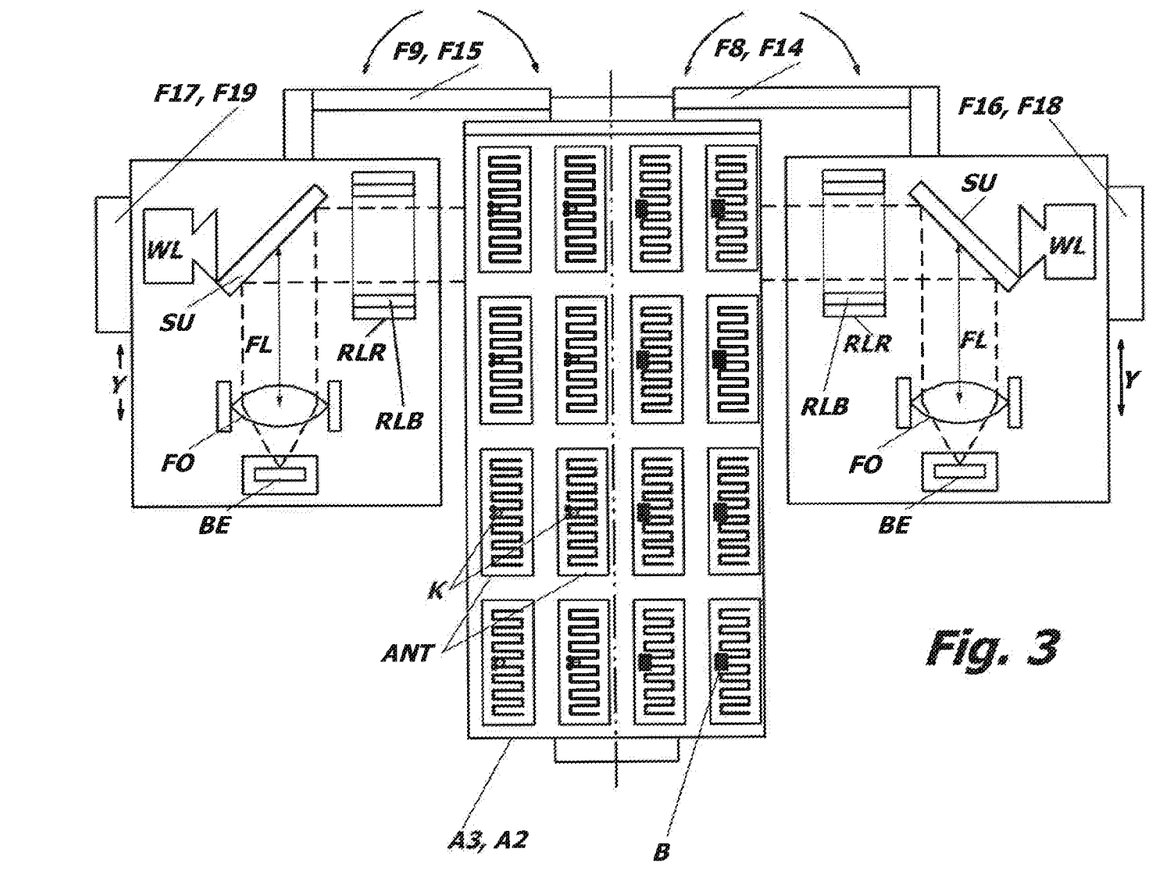
FIG. 3 shows a schematic plan view of the second to fifth inspection unit.

In FIG. 3, the second to fifth inspection units I2 . . . I5 are configured as described below for the devices described above for transferring electronic components B from a first substrate W to a second substrate BM and for applying adhesive K from a reservoir to a second substrate BM.

In one configuration, the image capturing unit BE (camera) can be moved in the Y-direction at the inspection units I2 . . . I5. In this variant the beam deflector can be omitted. Alternatively, the remaining optics comprising focusing optics, beam deflector and/or illumination can be moved in the Y-direction while the camera remains stationary and is not moved in the Y-direction. In this variant the camera is only set at an angle via the pivot arm.

An image capturing unit BE in the form of a camera has an associated illumination unit WL, RLB, BLB. The illumination unit WL, RLB, BLB has a white light source WL, an infrared light source RLR and a blue light source BLB. The illumination unit WL, RLB, BLB serves to direct light of different wavelengths onto the second holder A2. Different details of the components/sub-assemblies and of the adhesive can thus be captured visually by the image capturing unit BE, which is directed at the second substrate BM.

A sixteenth, seventeenth, eighteenth and/or nineteenth conveying unit F16 . . . F19 are each designed to convey the respective image capturing unit BE with the illumination unit WL, RLB, BLB associated with it along the second or third holder A2, A3, i.e. transversely to the conveying direction of the second substrate BM. In other words, sixteenth, seventeenth, eighteenth and/or nineteenth conveying unit F16 . . . F19 are Y-drives, and eighth, ninth, fourteenth and/or fifteenth conveying unit F8, F9, F14, F15 are motor pivot arms, the function of which can also be manually fulfilled.

The eighth, ninth, fourteenth and/or fifteenth conveying unit F8, F9, F14, F15 are used to convey the respective second, third, fourth and/or fifth inspection unit I2 . . . I5 relative to the respective second and/or third holder A2, A3 and the component assembly position AP or the adhesive application position KAP along the conveying direction FR of the second substrate BM. The respective second, third, fourth and/or fifth inspection unit I2 . . . I5 can thereby be advantageously adapted to different spacings of electronic sub-assemblies on the second substrate.

In the variant of the illumination unit WL, RLB, BLB shown, the infrared light RLR and the blue light source RLB are configured as a ring light source enclosing a capture area EB of the image capturing unit BE. The white light source WL is arranged on a side of a partially light-permeable beam deflector SU in the form of a 45° mirror, which side is remote from the capture area EB of the image capturing unit BE. The image capturing unit BE has focusing optics FO arranged at a fixedly adjustable spacing FL from the side facing it of an at least partially light-permeable beam deflector SU.

The invention claimed is:

1. An inspection unit of a transfer device for transferring electronic components from a first substrate to a second substrate, said inspection unit comprising:
   an illumination unit;
   an image capturing unit operatively coupled to the illumination unit, wherein the illumination unit is operatively associated with a holder and is configured to direct light of different wavelengths onto the holder, said holder being configured to carry the second substrate along its longitudinal extension in a conveying direction of the second substrate and said holder also being configured to support the second substrate at a location to be captured by the image capturing unit, wherein the holder has the shape of a circular cylindrical drum; and
   a first conveying unit that is configured to convey the image capturing unit and optics associated with the image capturing unit along the holder and transversely to the conveying direction of the second substrate, wherein the optics includes the illumination unit.

2. The inspection unit of a transfer device according to claim 1, further comprising a second conveying unit that is configured to convey the inspection unit relative to the holder and a component assembly position or an adhesive application position along a conveying direction of the second substrate.

3. The inspection unit of a transfer device according to claim 2, wherein the holder includes second substrate outlets on its surface that are configured to hold the second substrate on the holder by a vacuum.

4. The inspection unit of a transfer device according to claim 2, further comprising a pivot arm configured to adjust the inspection unit relative to the holder and the component assembly position or the adhesive application position along the conveying direction of the second substrate.

5. The inspection unit of a transfer device according to claim 1, wherein the illumination unit includes a white light source, an (infra-)red light source or a blue light source, and wherein in the illumination unit the (infra-)red light source or the blue light source is configured as a ring light source, which at least partially encloses a capture area of the image capturing unit.

6. The inspection unit of a transfer device according to claim 5, wherein in the illumination unit the white light source is arranged on a side that is remote from the capture area of the image capturing unit, of an at least partially light-permeable beam deflector.

7. The inspection unit of a transfer device according to claim 1, wherein the image capturing unit includes focusing optics that is positioned at a distance from a side of an at least partially light-permeable beam deflector facing the focusing optics.

8. A method for inspecting electronic components by an inspection unit in a transfer device for transferring the electronic components from a first substrate to a second substrate, said method comprising:
   providing an image capturing unit operatively coupled to an illumination unit, said illumination unit being operatively associated with a holder, wherein the illumination unit is configured to direct light of different wavelengths onto the holder, said holder being configured to carry the second substrate along its longitudinal extension in a conveying direction of the second substrate and said holder being configured to support the second substrate at a location that is to be captured by the image capturing unit, wherein the holder has the shape of a circular cylindrical drum;
   providing a conveying unit that is configured to convey the image capturing unit and optics associated with the image capturing unit along the holder and transversely to the conveying direction of the second substrate, wherein the optics includes the illumination unit;
   transferring electronic components from the first substrate to the second substrate by the conveying unit of the transfer device;
   applying an adhesive from a reservoir to the second substrate, said second substrate being configured to carry a plurality of electronic subassemblies in a longitudinal and traverse extension direction;
   transferring and applying the adhesive to one of the transferred electronic components to a respective subassembly from the first substrate; and
   inspecting the one of the transferred electronic components to a respective subassembly from the first substrate after the transferring and applying of the adhesive as so to form the respective subassembly of the plurality of electronic subassemblies.

* * * * *